United States Patent
Kruip et al.

(10) Patent No.: US 6,566,880 B1
(45) Date of Patent: May 20, 2003

(54) STABILIZATION OF A MAGNETIC FIELD OF A MAGNETIC RESONANCE IMAGING APPARATUS

(75) Inventors: Marcel Jan Marie Kruip, Oxford (GB); Nicholas David Parker, Harbury (GB)

(73) Assignee: Oxford Magnet Technology Limited, Oxford (GB)

( * ) Notice: Subject to any disclaimer, the term of this patent is extended or adjusted under 35 U.S.C. 154(b) by 0 days.

(21) Appl. No.: 09/787,008

(22) PCT Filed: Aug. 23, 1999

(86) PCT No.: PCT/GB99/02778

§ 371 (c)(1),
(2), (4) Date: Jun. 15, 2001

(87) PCT Pub. No.: WO00/16116

PCT Pub. Date: Mar. 23, 2000

(30) Foreign Application Priority Data

Sep. 11, 1998 (GB) .............................................. 9817940

(51) Int. Cl.[7] .................................................. G01V 3/00
(52) U.S. Cl. ...................................... 324/318; 324/322
(58) Field of Search ................................ 324/307, 309, 324/318, 320, 322

(56) References Cited

U.S. PATENT DOCUMENTS

| | | | |
|---|---|---|---|
| 4,660,013 A | * | 4/1987 | Laskaris et al. ............. 324/318 |
| 5,652,517 A | * | 7/1997 | Maki et al. .................. 324/318 |
| 5,675,305 A | * | 10/1997 | DeMeester et al. .......... 335/302 |
| 5,680,086 A | * | 10/1997 | Allis et al. .................. 335/296 |
| 5,731,704 A | * | 3/1998 | Schnur et al. ............... 324/320 |
| 6,194,899 B1 | * | 2/2001 | Ishihara et al. .............. 324/315 |
| 6,239,680 B1 | * | 5/2001 | Nagano et al. .............. 324/318 |
| 6,297,634 B1 | * | 10/2001 | Aoki ............................ 324/315 |
| 6,437,672 B1 | * | 8/2002 | Takeshima et al. ......... 335/216 |
| 6,489,873 B1 | * | 12/2002 | Kruip et al. ................. 335/300 |

FOREIGN PATENT DOCUMENTS

| | | | |
|---|---|---|---|
| GB | 2341447 | * | 3/2000 |
| GB | 2341448 | * | 3/2000 |

OTHER PUBLICATIONS

Copy of British Search Report.

* cited by examiner

Primary Examiner—Edward Lefkowitz
Assistant Examiner—Dixomara Vargas
(74) Attorney, Agent, or Firm—Crowell & Moring LLP

(57) ABSTRACT

Apparatus is provided for generating an accurate magnetic field in a magnetic resonance imaging device. The device comprises a number of permanent magnet assemblies (1) each of which is in thermal contact with a plate (5) having good thermal conductivity, the plate (5) is positioned between said permanent magnetic assemblies (1) and gradient coils (3). The plate (5) has connected thereto one or more temperature sensors (7) which provide a signal to control circuit (8) which is arranged to control the operation to a plurality of thermoelectric heat pumping devices (9) which are connected to a plate (5) so that the overall heat generated by the heat pumping devices (9) and the gradient coils (3) is kept constant and is dissipated by a yoke (10) of the magnetic resonance imaging apparatus.

4 Claims, 1 Drawing Sheet

STABILIZATION OF A MAGNETIC FIELD OF A MAGNETIC RESONANCE IMAGING APPARATUS

The present invention relates to the stabilisation of a magnetic field of a magnetic resonance imaging (MRI) apparatus, generated by permanent magnets, against variation of temperature due to operation of gradient coils.

A magnetic field with a high degree of stability and homogeneity is essential for the successful application of a number of analytical techniques such as MRI. Assemblies comprising large amounts of permanent magnetic material can be used for the generation of such magnetic field.

Most permanent magnetic materials with sufficient energy density to be useful for these applications are generally sensitive to temperature variations. MRI devices require a controlled and rapid temporal or spatial variation of the principal magnetic field component. This is achieved by so called gradient coils. The gradient coils are generally located near the pole pieces, which include the permanent magnetic material. The gradient coils can dissipate a considerable amount of heat. Even though the gradient coils are cooled by air or by liquid such as water, it is difficult to avoid a temperature rise after operation of the gradient coils. This increase of temperature will result in a flux of heat into the rest of the magnetic structure and will result in an increase of the temperature of the permanent magnetic material. The temperature increase will result in a drift of the magnetic field which will adversely effect the quality of the image.

An aim of the present invention is to provide means to minimise variations of the temperature of the permanent magnetic assemblies when gradient coils are operated.

JP-A-5212012 discloses a magnetic resonance imaging system in which a permanent magnet is held at a prescribed temperature. A feedback system is provided which comprises a sensor and temperature control means for holding the permanent magnet at the prescribed temperature. The temperature control means comprises heat conducting means in the form of a plurality of heat pipes connected to a fin arrangement which can either be heated by a heater incorporated therein or cooled by a fan in accordance with the detected temperature. The sensor is mounted on one of the heat pipes for detecting the temperature caused by heat generation at a gradient magnetic field coil and provides signals for controlling the heat conducting means provided between the gradient coil and the permanent magnet to maintain the prescribed temperature.

According to the present invention there is provided a magnetic resonance imaging device comprising: gradient coils; a yoke; a number of permanent magnet assemblies mounted on the yoke; a plate having good thermal conductivity and being positioned between said permanent magnet assemblies and said gradient coils, each magnet assembly being in thermal contact with a plate; one or more temperature sensors associated with said plate; and a control circuit; characterised in that the device further comprises current measurement means for measuring current supplied to said gradient coils, and a plurality of thermoelectric heat pumping devices connected to said plate and which are controlled by said control circuit in accordance with input signals from said temperature sensors and said current measurement means so that the overall heat generated by said thermoelectric heat pumping devices and said gradient coils is kept constant and is dissipated by said yoke.

In one embodiment of the present invention, the thermoelectric heat pumping devices are fitted on a face of the plate between the gradient coils and the permanent magnetic material.

In another embodiment of the present invention, the thermoelectric heat pumping devices are fitted to an edge of said plate.

An embodiment of the present invention there is provided with reference to the accompanying drawings wherein.

Figure 1:
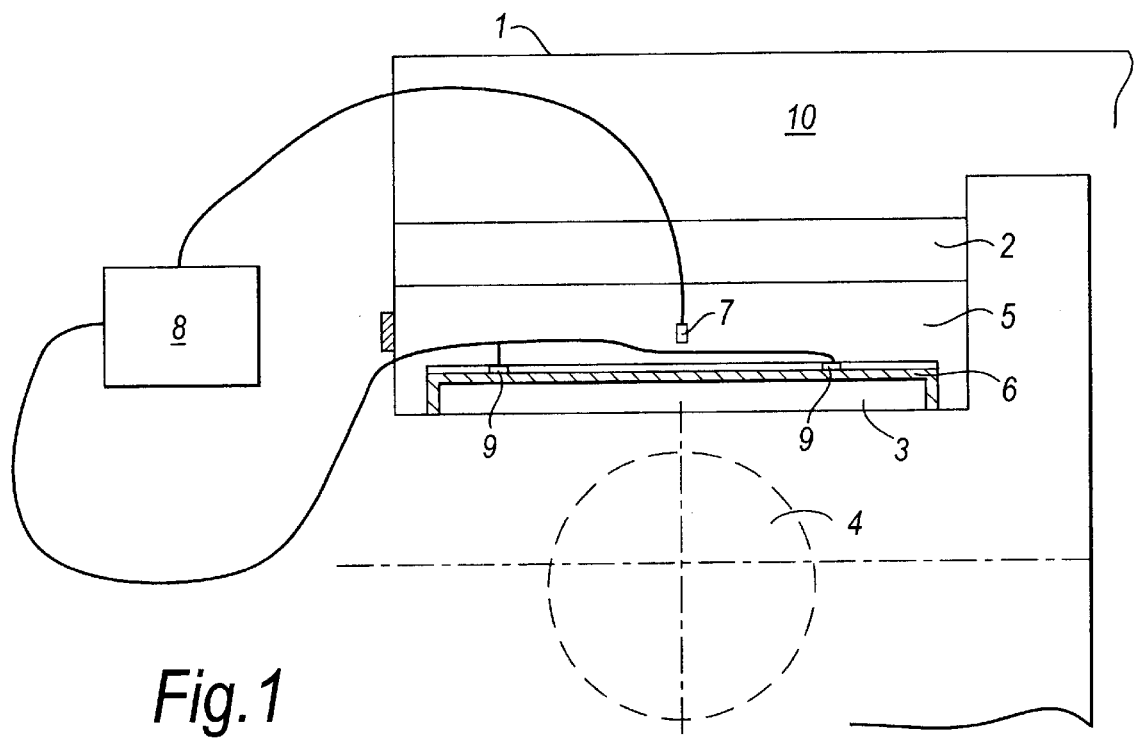
FIG. 1 shows a first embodiment of the present invention.

Referring to FIG. 1, a permanent magnetic assembly 1 consisting of a layer of permanent magnetic material 2. The gradient coils 3 are located between the permanent magnetic material 2 and the space 4 where good field quality is required. The permanent magnetic material 2 is in good thermal contact with a plate 5 having good thermal conductive properties. Between the gradient coils 3 and the plate 5 there is a thermally insulating layer 6. The plate 5 is fitted with one or more temperature sensors 7 such as thermistors or thermal resistive devices. The temperature sensors provide an input signal to a control circuit 8. The control circuit 8 controls the current to the thermoelectric heat pumping devices 9 which are fixed to the plate 5. Self adhesive heater pads readily available commercially, would be suitable for this purpose because of ease of mounting and the relatively small thickness of the thermoelectric heat pumping devices which means that the magnetic efficiency of the circuit is not greatly compromised. If transient effects are not taken into consideration, the control circuit is arranged to keep the sum of the heat introduced by the thermoelectric heat pumping devices and the heat introduced by the gradient coils constant. The heat flux from the plate 5 will flow through the permanent magnetic material and will be sinked into a yoke 10. The temperature of the yoke is kept sufficiently constant so that the temperature gradient generated by the heat flow will not change significantly over time. Alternatively, the temperature of the yoke 10 is measured and used as input to the temperature control algorithm.

Figure 2:
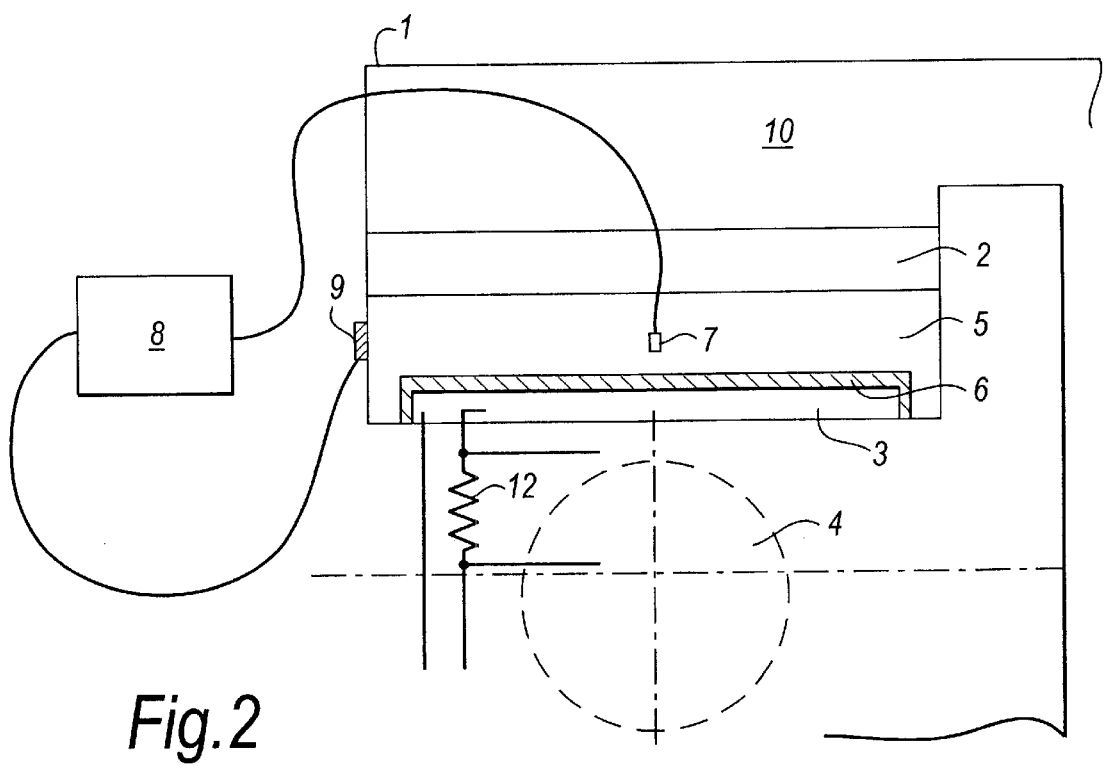
FIG. 2 shows a second embodiment of the present invention.

An alternative arrangement is shown in FIG. 2. In this arrangement, instead of mounting the thermoelectric heat pumping devices 9 on the flat surface of the plate 5, the heat pumping devices can be mounted at the edge of the plate 5. This gives better access to the heat pumping devices, which facilitates the use of thermoelectric heat pumping devices 9 because this arrangement allows the connection of heat source/sinks to the thermoelectric heat pumping devices. The heat generated by the gradient coils is a function of the current and the temporal structure of the current supply to the gradient coils. This current can be measured by several means, for example by a resistive shunt 12 or by a DC transformer.

The present invention as described provides a fast and effective means of minimising field drift due to the operation of the gradient coils, in a magnet assembly comprising permanent magnets.

What is claimed is:

1. A magnetic resonance imaging device comprising:

gradient coils;

a yoke;

a number of permanent magnet assemblies mounted on the yoke;

a plate having good thermal conductivity and being positioned between said permanent magnet assemblies and said gradient coils, each magnet assembly being in thermal contact with said plate;

a control circuit;

current measurement means for measuring current supplied to said gradient coils; and a plurality of thermoelectric heat pumping devices connected to said plate and which are controlled by said control circuit in accordance with input signals from said temperature sensors and said current measurement means whereby overall heat generated by said thermoelectric heat pumping devices and said gradient coils is kept constant and is dissipated by said yoke.

2. The apparatus according to claim 1, wherein said thermoelectric heat pumping devices are fitted on a face of said plate between said gradient coils and said number of permanent magnetic assemblies.

3. The apparatus according to claim 1, wherein said thermoelectric heat pumping devices are fitted to an edge of said plate.

4. Apparatus as claimed in claim 1, wherein current supply to the gradient coils is measured and used as an input to the control circuit.

* * * * *